United States Patent
Ambo et al.

(10) Patent No.: US 8,362,366 B2
(45) Date of Patent: *Jan. 29, 2013

(54) CIRCUIT BOARD, ITS MANUFACTURING METHOD, AND JOINT BOX USING CIRCUIT BOARD

(75) Inventors: Tsugio Ambo, Tokyo (JP); Satoru Fujiwara, Tokyo (JP); Yoshikatsu Hasegawa, Tokyo (JP); Chihiro Nakagawa, Tokyo (JP); Takeshi Ono, Tokyo (JP); Atsushi Urushidani, Tokyo (JP); Tooru Kashioka, Tokyo (JP); Katsuji Shimazawa, Tokyo (JP)

(73) Assignee: Mitsubishi Cable Industries, Ltd., Tokyo (JP)

( * ) Notice: Subject to any disclaimer, the term of this patent is extended or adjusted under 35 U.S.C. 154(b) by 71 days.

This patent is subject to a terminal disclaimer.

(21) Appl. No.: 13/006,222

(22) Filed: Jan. 13, 2011

(65) Prior Publication Data

US 2011/0116248 A1    May 19, 2011

Related U.S. Application Data

(63) Continuation of application No. 10/593,796, filed as application No. PCT/JP2005/005811 on Mar. 29, 2005, now Pat. No. 7,943,859.

(30) Foreign Application Priority Data

| Mar. 31, 2004 | (JP) | 2004-105997 |
| Aug. 19, 2004 | (JP) | 2004-239707 |
| Dec. 28, 2004 | (JP) | 2004-381266 |

(51) Int. Cl.
    *H05K 1/11*    (2006.01)

(52) U.S. Cl. ............ 174/261; 174/138 G; 361/764; 361/742; 361/784; 361/785; 361/790; 361/807; 439/68; 439/72; 439/82; 439/787; 257/737

(58) Field of Classification Search ............ 174/261, 174/138 G; 361/764, 784, 785, 790, 742, 361/807; 439/68, 72, 82, 787; 257/737
See application file for complete search history.

(56) References Cited

U.S. PATENT DOCUMENTS
(Continued)

FOREIGN PATENT DOCUMENTS

| JP | 04-345082 A | 12/1992 |
| JP | 05-167207 A | 7/1993 |

(Continued)

OTHER PUBLICATIONS

Microfilm of the specification and drawings annexed to the request of Japanese Utility Model Appln. No. 45623/1990 (Laid open No. 005670/1992); The Furukawa Electric Co., Ltd.; Jan. 20, 1992.

(Continued)

*Primary Examiner* — Xiaoliang Chen
(74) *Attorney, Agent, or Firm* — Holtz, Holtz, Goodman & Chick, P.C.

(57) ABSTRACT

A circuit board includes a foil circuit provided on a synthetic resin plate formed by injection molding, made of a copper foil, and having a pattern different for the circuit board. Anchor pins projecting upward are provided on the resin plate and passed through pinholes made in the foil circuit. The foil circuit is positioned and secured to the resin plate. In a required portion of the resin plate, a terminal insertion hole is provided, and a receiving terminal is secured to the required portion of the terminal insertion hole and connected to the foil circuit.

3 Claims, 16 Drawing Sheets

U.S. PATENT DOCUMENTS

| | | | |
|---|---|---|---|
| 3,674,914 A * | 7/1972 | Burr | 174/261 |
| 3,688,248 A * | 8/1972 | Modrey | 439/787 |
| 4,333,233 A * | 6/1982 | Dodson et al. | 29/845 |
| 4,435,741 A * | 3/1984 | Shimizu et al. | 361/764 |
| 4,487,463 A * | 12/1984 | Tillotson | 439/68 |
| 4,641,426 A * | 2/1987 | Hartman et al. | 29/839 |
| 4,769,907 A * | 9/1988 | Sebastien | 29/874 |
| 4,775,326 A * | 10/1988 | Lenaerts et al. | 439/82 |
| 4,780,957 A * | 11/1988 | Shiga et al. | 29/830 |
| 4,867,691 A * | 9/1989 | Eck | 439/82 |
| 4,937,932 A * | 7/1990 | Ishii | 29/622 |
| 4,948,375 A * | 8/1990 | Lawrence et al. | 439/72 |
| 4,950,170 A * | 8/1990 | Miller, Jr. | 439/74 |
| 4,950,173 A * | 8/1990 | Minemura et al. | 439/82 |
| 5,017,145 A * | 5/1991 | Kanai et al. | 439/45 |
| 5,373,626 A * | 12/1994 | Youngfleish | 29/739 |
| 5,434,749 A * | 7/1995 | Nakayama | 361/775 |
| 5,456,608 A * | 10/1995 | Rogers et al. | 439/48 |
| 5,718,057 A * | 2/1998 | Rosli et al. | 33/617 |
| 5,836,582 A * | 11/1998 | Ogawa et al. | 271/12 |
| 5,893,762 A * | 4/1999 | Kajiwara et al. | 439/72 |
| 5,937,932 A * | 8/1999 | Cornie | 164/526 |
| 6,049,043 A | 4/2000 | Tonejc | |
| 6,265,842 B1 * | 7/2001 | Hard et al. | 318/466 |
| 6,995,650 B2 * | 2/2006 | Hayashi et al. | 338/162 |
| 7,099,155 B2 * | 8/2006 | Kobayashi et al. | 361/719 |
| 7,943,859 B2 * | 5/2011 | Ambo et al. | 174/261 |
| 2001/0048492 A1 * | 12/2001 | Natsuyama | 349/58 |
| 2003/0102357 A1 * | 6/2003 | Downes | 228/180.1 |
| 2007/0218257 A1 * | 9/2007 | Ambo | 428/209 |
| 2011/0116248 A1 * | 5/2011 | Ambo et al. | 361/796 |
| 2011/0120756 A1 * | 5/2011 | Ambo et al. | 174/255 |

FOREIGN PATENT DOCUMENTS

| | | |
|---|---|---|
| JP | 08-153425 A | 6/1996 |
| JP | 08-223742 A | 8/1996 |
| JP | 09-153516 A | 6/1997 |
| JP | 10-242592 A | 9/1998 |
| JP | 10-243526 A | 9/1998 |

OTHER PUBLICATIONS

Notification Concerning Transmittal of International Search Report of the International Searching Authority, Dated Jul. 12, 2005, for PCT/JP2006/325670, 7 sheets.

* cited by examiner

CIRCUIT BOARD, ITS MANUFACTURING METHOD, AND JOINT BOX USING CIRCUIT BOARD This application is a Continuation of U.S. application Ser. No. 10/593,796, filed Feb. 2, 2007 now U.S. Pat. No. 7,943,859, which is a U.S. National Phase Application under 35 USC 371 of International Application PCT/JP2005/005811, filed Mar. 29, 2005, the entire contents of both of which are incorporated herein by reference.

BACKGROUND OF THE INVENTION

1. Field of the Invention

The present invention relates to a circuit board for use in various electronic devices and joint boxes for connecting, dividing and joining various kinds of electric wires, a method of manufacturing such a circuit board, and also relates to a joint box including such circuit boards.

2. Related Art Statements

There have been known various types of joint boxes. For instant, in Document 1 (Japanese Patent Publication Kokai Hei 10-243526 of Japanese Patent Application assigned to the same assigner to which the instant application has been assigned), there is disclosed a known joint box in which a plurality of FFC (flexible flat cables) are stacked one another and are subjected to a rather complicated circuit constituting treatment. In this known joint box, a conductive foil 1 having a given circuit pattern formed therein is sandwiched between a pair of insulating sheets 2 to form a flat cable layer 3 as illustrated in FIG. 28.

A plurality of flat cable layers 3 are stacked one another and a plurality of common holes 4 are formed in such a manner that a conductive foil 1 of a given flat cable layer 3 is exposed within respective common holes 4. Then, an exposed portion of the relevant conductive foil 1 is fused to a lower end of a connection terminal 5 provided on the uppermost flat cable layer 3.

Document 1: Japanese Patent Application Kokai Hei 10-243526

DISCLOSURE OF THE INVENTION

Problems to be Solved by the Invention

In the above-mentioned known joint box, the flat cable layers 3 could not be formed easily and a manufacturing cost is liable to increase. Furthermore, the operation for connecting the conductive foil 1 to the connection terminal 5 via the hole 4 is cumbersome and the electrical connection between the conductive foil 1 and the connection terminal 5 is liable to unstable.

The present invention has for its object to provide a circuit board which can remove the above mentioned problems of the known circuit board and can be used for various electrical devices. It is another object of the invention to provide a method of manufacturing a circuit board in easy and less expensive manner. It is still another object of the invention to provide a joint box including such circuit boards.

Means for Solving the Problems

According to one aspect of the invention, a circuit board comprises a resin plate formed by a three-dimensional mold of an electrically insulating synthetic resin; and a circuit pattern formed by a metal foil and placed on said resin plate.

According to another aspect of the present invention, a circuit board comprises a resin plate formed by a three-dimensional mold of an electrically insulating synthetic resin; a circuit pattern formed by at least one foil circuit punched out of a metal foil into a given pattern and placed on said resin plate; and a plurality of reception terminals provided in a plurality of terminal receiving holes formed in said resin plate such that said reception terminals are connected to said circuit pattern.

According to another aspect of the invention, a circuit board comprises a resin plate formed by a three-dimensional mold of an electrically insulating synthetic resin; a circuit pattern formed by at least one foil circuit punched out of a metal foil into a given pattern and placed on said resin plate; and a plurality of tubular reception terminals clamped in a plurality of terminal receiving holes formed in said resin plate; whereby said metal foil of the circuit pattern has formed therein a plurality of cut portions at positions corresponding to said terminal receiving holes such that a plurality of connection terminals can be inserted into said reception terminals through said cut portions.

The present invention also relates to a method of manufacturing a circuit board and provides a method of manufacturing a circuit board comprising a resin plate formed by a three-dimensional mold of an electrically insulating synthetic resin and a circuit pattern placed on said resin plate, comprising:

punching said circuit pattern out of a metal foil into a given pattern by means of Thompson blades;

holding said circuit pattern between said Thompson blades;

transporting said circuit pattern onto said resin plate; and fixing said circuit pattern to said resin plate.

The present invention also relates to a joint box including circuit boards, and provides a joint box comprising:

a stack of circuit boards each of which includes a resin plate formed by a three-dimensional mold of an electrically insulating synthetic resin and a circuit pattern formed by at least one foil circuit punched out of a metal foil into a given pattern and placed on said resin plate;

a plurality of terminal receiving holes commonly formed in the stacked circuit boards;

a plurality of tubular metal reception terminals each of which includes a tab portion and is provided in a terminal receiving hole formed in a given layer circuit board of said stack, said tab portion being connected to a circuit pattern of the relevant circuit board; and a plurality of insertion terminals including pin-shaped inserting ends inserted into said terminal receiving holes such that the insertion terminals are connected to said reception terminals to establish electrically connection between said circuit patterns of the circuit boards.

According to another aspect of the invention, a joint box comprises:

a stack of circuit boards each of which includes a resin plate formed by a three-dimensional mold of an electrically insulating synthetic resin and a circuit pattern formed by at least one foil circuit punched out of a metal foil into a given pattern and placed on said resin plate;

a plurality of terminal receiving holes commonly formed in resin plates of the stacked circuit boards;

a plurality of cut portions formed in said circuit patterns;

a plurality of tubular metal reception terminals provided in said terminal receiving holes formed in given layer circuit boards; and a plurality of insertion terminals having pin-shaped inserting ends inserted into said terminal receiving holes through said cut portions such that the insertion terminals are connected to said reception terminals to establish electrically connection between said circuit patterns of the circuit boards.

Effect of the Invention

According to a method of manufacturing a circuit board in the invention, since a circuit pattern formed by a metal foil and placed on said resin plate, simple formation and manufacturing of a circuit board is feasible.

According to a joint box in the invention, since a stack of circuit boards comprising a circuit pattern formed by a foil circuit punched out of a metal foil, a thinner joint box can be manufactured even in a complex circuit.

Figure 1:
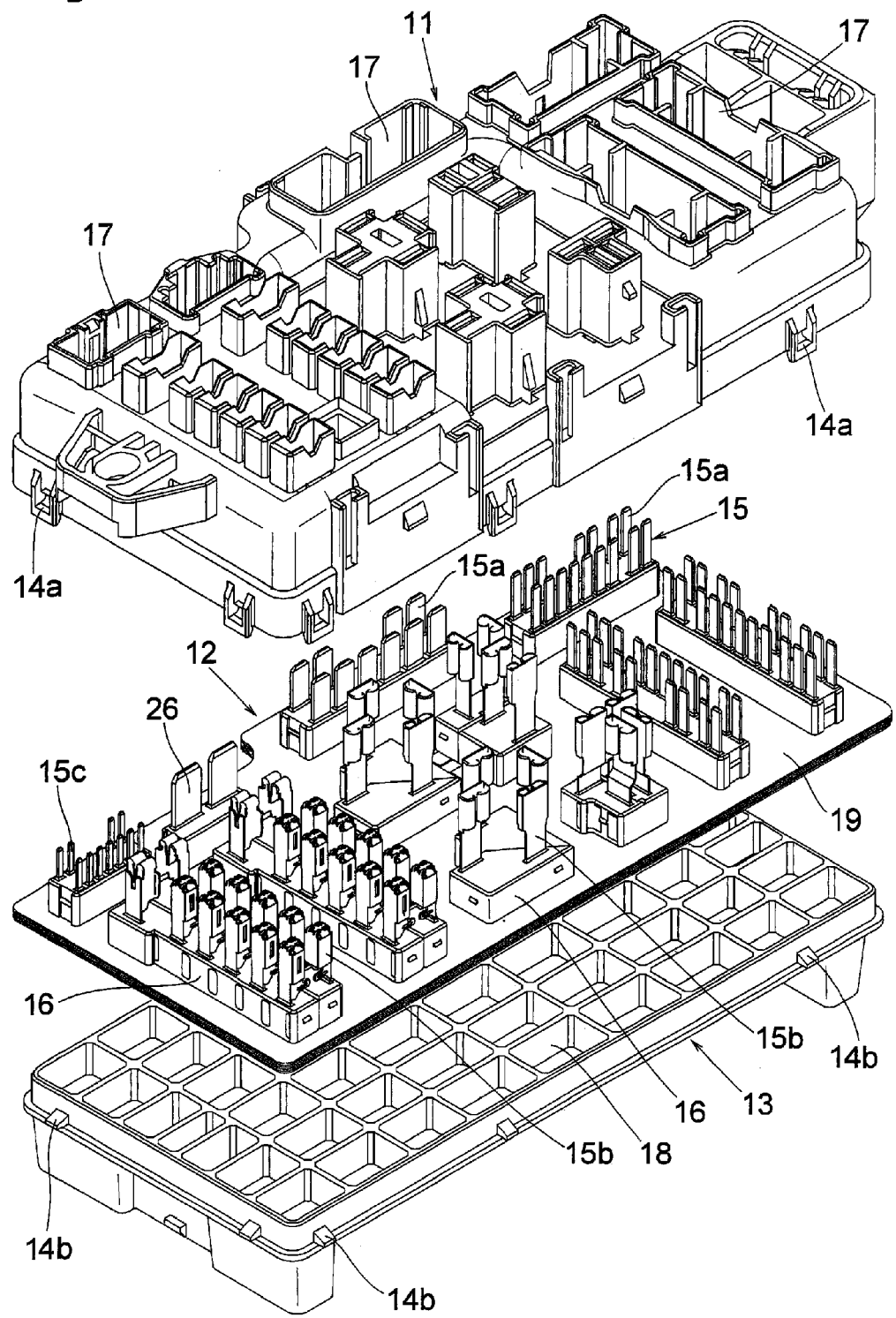
FIG. 1 is an exploded perspective view showing an upper case, a circuit unit and a lower case of the joint box according to the invention.

EXPLANATION OF REFERENCE NUMERALS 12, 97 Circuit unit
15 Insertion terminal
16 Block body
19, 91 Circuit board
20, 92 Resin plate
20c, 92b Terminal receiving hole
21, 93 Metal foil circuit
22 Reception terminal
23 Rectangular electric wire
41 Copper foil
49, 55 Punching press
49a, 55a Thompson blade
55b Suction pad
71 electric wire
95 Roller
96 Connecting terminal

DESCRIPTION OF THE PREFERRED EMBODIMENTS

A present invention will be explained in detail according to embodiments shown in FIG. 1 to FIG. 27.

FIG. 1 is an exploded perspective view showing an embodiment of the joint box including the circuit board according to the invention. The joint box is formed by composing an upper case 11, a circuit unit 12 and a lower case 13. That is to say, the circuit unit 12 is sandwiched between the upper case 11 and the lower case 13, and then the upper case 11 and lower case 13 are coupled with each other by means of locking portions 14a and 14b.

On an upper surface of the circuit unit 12, a given circuit pattern is formed, but for the sake of clarity, the circuit pattern is not shown in the drawing. On the upper surface of the circuit unit 12, there are arranged a plurality of block bodies 16 made of a synthetic resin and a plurality of insertion terminals 15 are secured to each block bodies 16. The block bodies 16 are clamped into frame portions 17 formed in the upper case 11 such that connecting portions such as flat blade ends 15a, reception ends 15b and pin ends 15c situate within the frame portions 17. It should be noted that connectors accommodating fuse elements, switch elements and another connecting terminals may be connected to these connecting portions.

In the lower case 13 there are also formed frame portions 18, and connecting ends of the connection terminals 15 are extended downward from block bodies 16 provided on a lower surface of the circuit unit 12 and similar electrical elements and connectors may be coupled with the lower surface of the lower case 13.

It should be noted that electronic circuit units may be provided in the joint box. Furthermore, terminals may be provided to extend outwardly and adjacent joint boxes each including electronic circuit units may be coupled with each other by means of the terminals.

Figure 2:
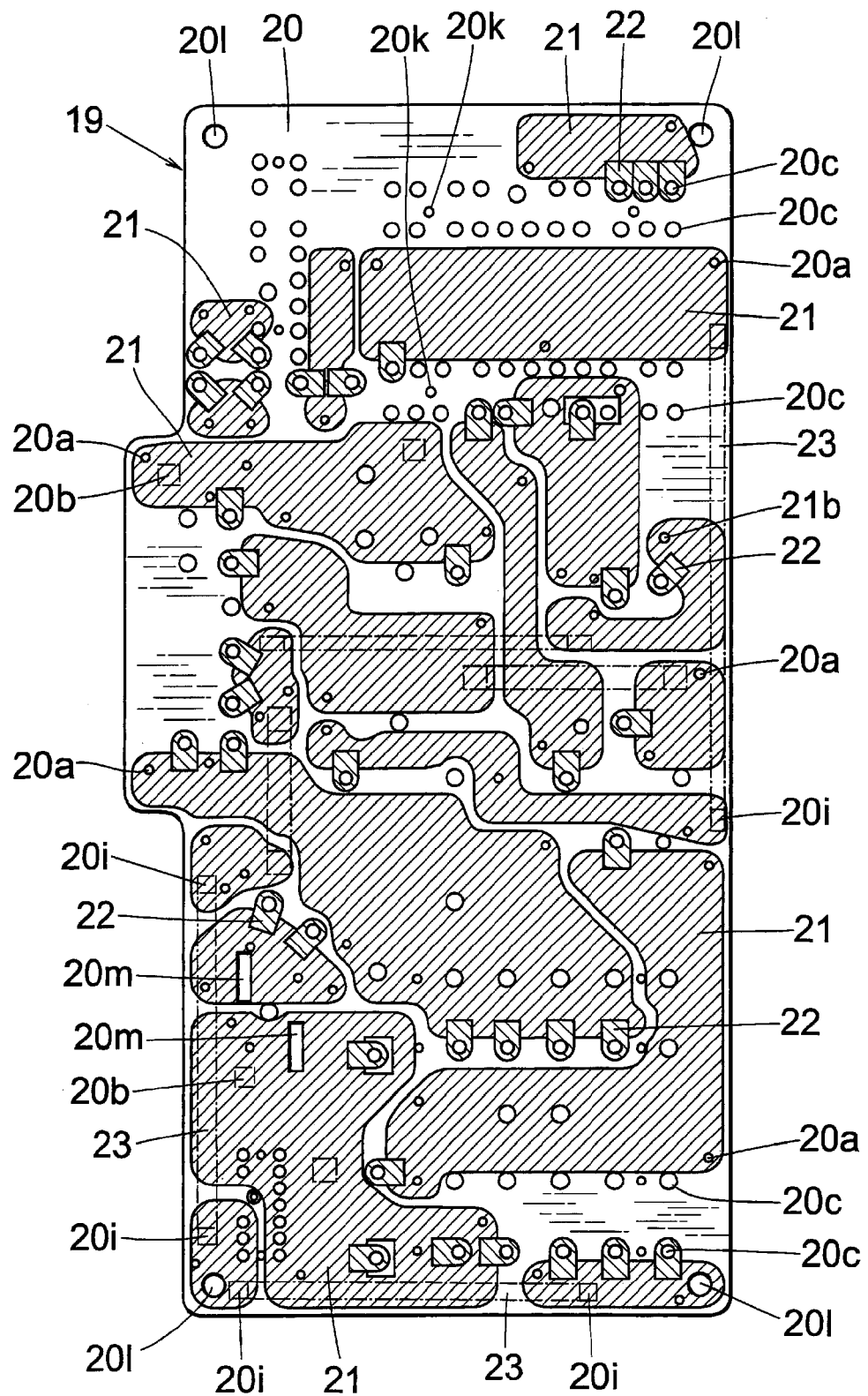
FIG. 2 is a plan view illustrating the circuit board according to the invention.
Figure 3:
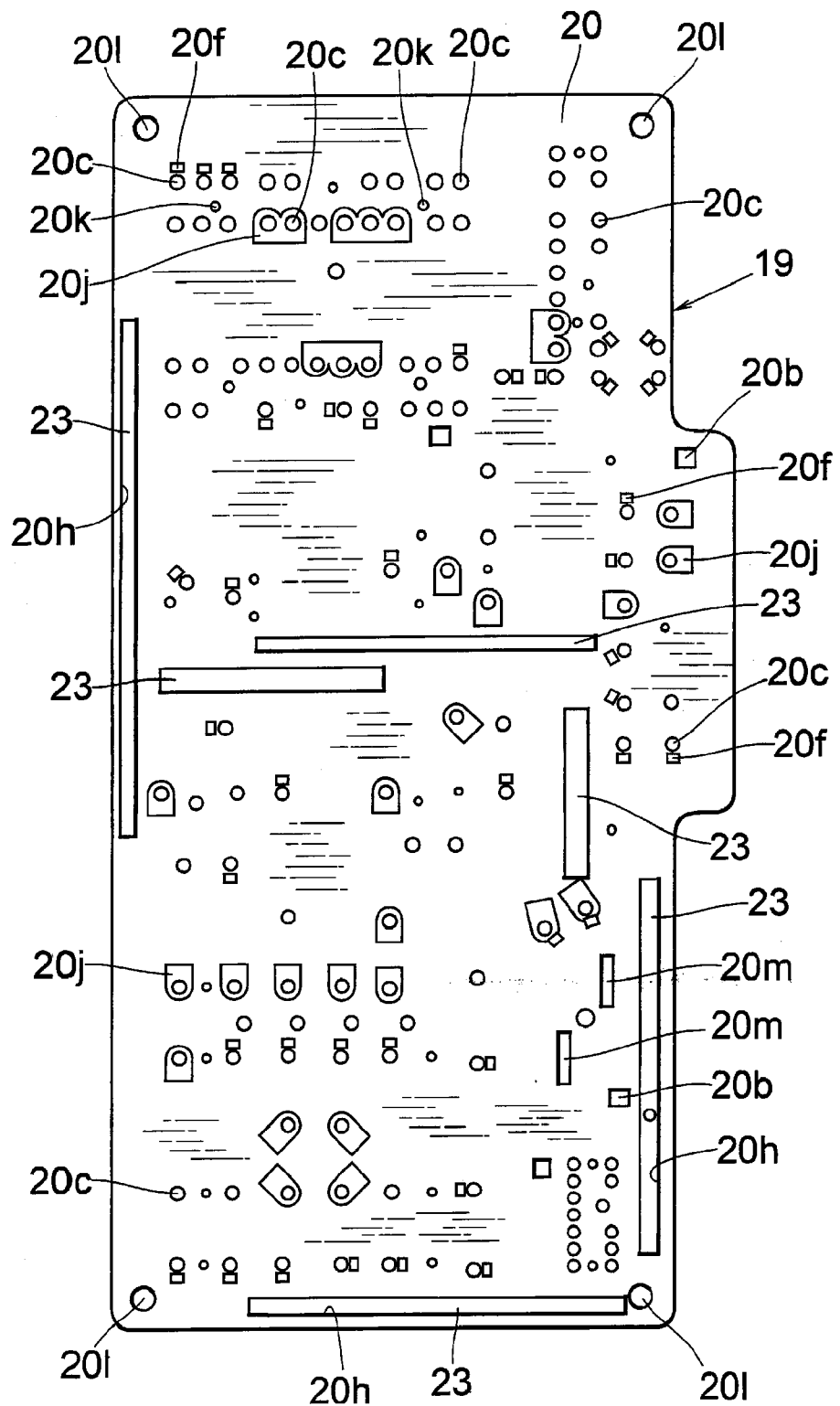
FIG. 3 is a bottom view of the circuit board.

The circuit unit 12 comprises a stack of five circuit boards 19 and each of the circuit boards 19 includes a resin plate 20 having a thickness of about 1.5 mm and a foil circuit 21 having a given circuit pattern as illustrated in FIGS. 2 and 3, the foil circuit 21 being placed on the resin plate 20. The resin plate 20 may be formed by injection molding of synthetic resin. The foil circuit 21 may be formed by a copper foil having thickness of 120 μm. The five circuit boards 19 have respective foil circuits 21 having different circuit patterns.

Figure 4:
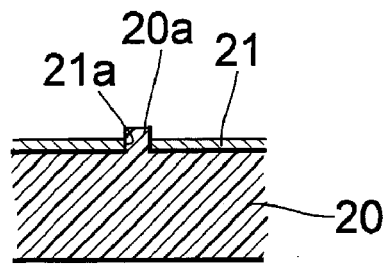
FIG. 4 is a cross sectional view depicting a part of the circuit board.

The resin plate 20 have a plurality of anchor pins 20a extending upward at given positions on a surface thereof. These anchor pins 20a are inserted into pin receiving holes 21a formed in the foil circuit 21 as depicted in FIG. 4. The foil circuit 21 is fixed to the resin plate 20 by heating and pushing downward top portions of the anchor pins 20a.

Figure 5:
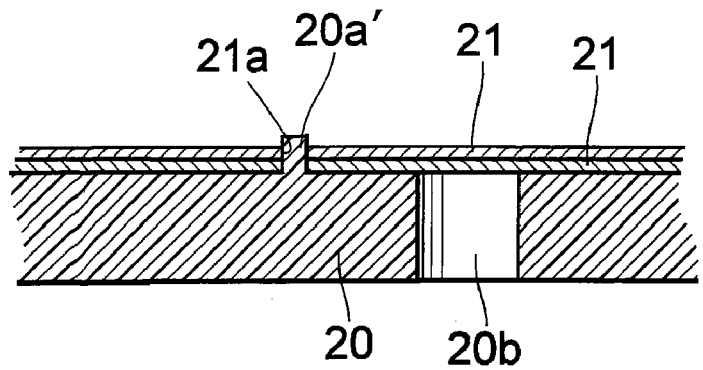
FIG. 5 is a cross sectional view showing a part of the circuit board comprising two metal foils stacked one on the other.

Depending upon a current capacity, one or more foil circuits 21 may include two or more than two metal foils as shown in FIG. 5. In the embodiment shown in FIG. 5, two metal foils 21 are fixed to the resin plate 20 by means of anchor pin 20a' having a larger length. The stacked metal foils 21 are coupled with one another by inserting a welding electrode through a welding hole portion 20b.

A plurality of circular terminal receiving holes 20c are formed in the resin plate 20 as illustrated in FIGS. 2 and 3 such that in the stack of the circuit boards 19, these terminal receiving holes 20c are aligned with one another. In a circuit board 19 of a given layer within the stack of circuit boards, each metal foil circuit 21 has formed therein a hole having an identical diameter as that of the terminal receiving hole 20c and a reception terminal 22 is provided in this hole. It should be noted that there are prepared various reception terminals 22 having different sizes depending upon a desired current capacity and, accordingly, the corresponding terminal receiving holes 20c having different diameters are prepared.

Figure 6:
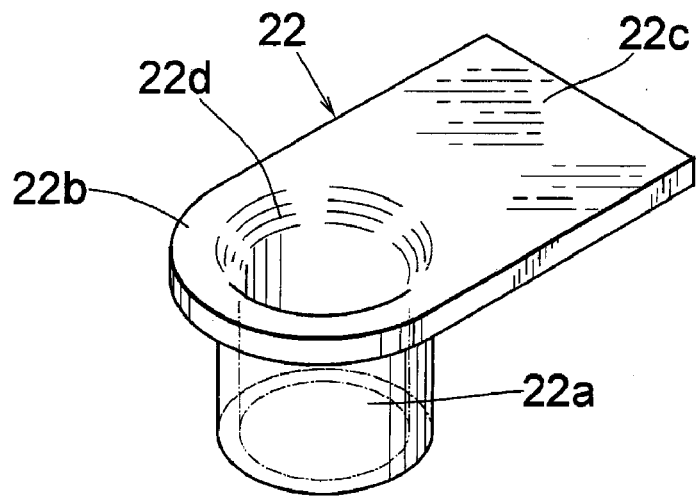
FIG. 6 is a perspective view illustrating a reception terminal.

The reception terminal 22 is made from a brass plate with a thickness of 0.2 mm and is formed by a forming press. As illustrated in FIG. 6, the reception terminal 22 comprises a tubular connecting portion 22a having a relatively small length, a flange portion 22b and a tab portion 22c extending from the flange portion 22b. Furthermore, a tapered guide portion 22d for guiding an insertion terminal is formed between the tubular connecting portion 22a and the flange portion 22b.

Figure 7:
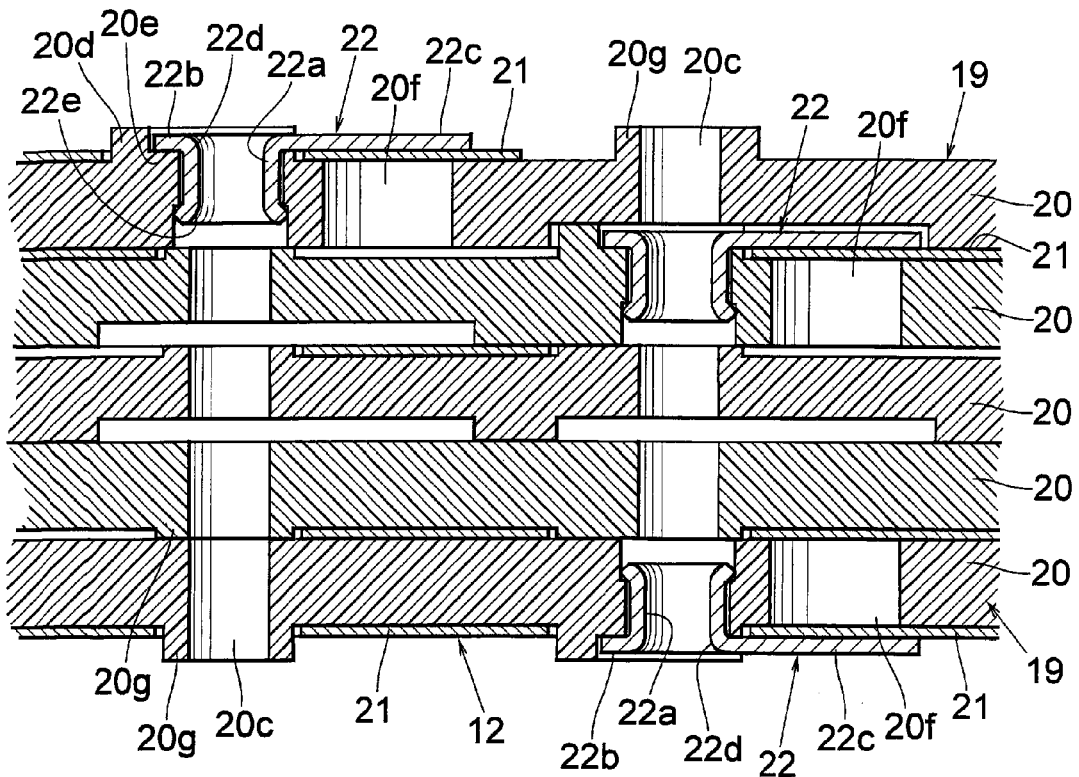
FIG. 7 is a cross sectional view depicting a maj or portion of the circuit board having reception terminals fixed thereto.

FIG. 7 is a cross sectional view showing a major portion of the circuit unit 12 in which five circuit boards 19 are stacked one another and the reception terminals 22 are provided at given positions. An inner diameter of the terminal receiving holes 20c of the circuit boards 19 is substantially identical with an outer diameter of the tubular connecting portion 22a of the reception terminal 22. Peripheries of upper end portions of the terminal receiving holes 20c are raised outwardly to form circular ring portions 20d, and step portions 20e are formed in the circular ring portions 20d. A lower half of the terminal receiving hole 20c has a larger diameter such that a lower end of the tubular connecting portion 22a can be extended outwardly.

It should be noted that in the present embodiment, the terminal receiving holes 20c into which the reception terminals 22 are not inserted have an inner diameter substantially identical with that of the reception terminal 22, but according to the invention, all the terminal receiving holes 20c may be formed to have an identical diameter.

The tubular connecting portions 22a of the reception terminal 22 is situated within the terminal receiving hole 20c and a lower portion of the tubular connecting portion 22a is caulked to the terminal receiving hole 20c by widening a lower end of the connecting portion 22a. A primary object of the of widening the lower end of the tubular connecting portion 22a is to fix the reception terminal 22 to the circuit board 19, but it also serves as a tapered guide portion 22e upon inserting a insertion terminal 15 into the reception terminal 22 from the bottom side. The tab portions 22c are fused onto the foil circuits 21 of the circuit boards 19. To this end, welding holes 20f are formed in given resin plates 20 at given positions corresponding to the tab portions 22c.

Around upper ends of terminal receiving holes 20c into which no reception terminals 22 of the circuit boards 19 are not inserted, there are formed circular ring proportions 20g such that the insertion terminals 15 are not contacted with the foil circuits 21 although the foil circuits 21 are existent around these terminal receiving holes 20c. The circular ring portions 20g provided in the uppermost circuit board 19 of the circuit unit 12 has a same level as the circular ring portions 20d provided at the terminal receiving holes 20c into which the reception terminals 22 are inserted, and therefore the block bodies 16 can be placed on the uppermost circuit board stably.

As shown in FIGS. 2 and 3, in the lower surfaces of the resin plates 20, there are formed electric wire receiving recesses 20h into which rectangular electric wires 23 having electrically insulating coatings applied thereon are inserted. Both ends of each rectangular electric wire 23 are bent upwardly through electric wire inserting holes 20i and are fused to lower surfaces of foil circuits 21. Then, the rectangular electric wires 23 serve as a jumper for electrically connecting circuit patterns of the foil circuits 21 which could not be connected to each other on the surface of the resin plate 20. It should be noted that there are prepared various kinds of the rectangular electric wires 23 having different cross sectional areas depending on the current capacity.

The thermally fused top portions of the anchor pins 20a, circular ring portions 20d and reception terminals 22 are clamped into depressions formed in a lower surface of an upper resin plate 20 such that the circuit boards 19 in the stack are brought into intimate contact with one another and could not be deviated horizontally, i.e. laterally. For instance, the reception terminals 22 secured to a lower level circuit board 19 are clamped into depressions 20j shown in FIG. 3. In each resin plate 20 there are formed through holes 20l at four corners, said through holes 20l serving as positioning holes for stacking the circuit boards 19.

As depicted in FIGS. 2 and 3, each of the circuit boards 19 further includes rectangular holes 20m for securing large current connection terminals 26 shown in FIG. 1 when only the reception terminals 22 could not share a required large current. The rectangular holes 20m are formed only in the uppermost circuit board 19 in the circuit unit 12.

All the circuit boards 19 are not always stacked in such a fashion that the foil circuits 21 face upwardly. In FIG. 7, upper three circuit boards 19 are stacked with the foil circuits 21 facing upward and lower two circuit boards 19 are stacked such that the foil circuits 21 face downward. Although not shown in the drawings, the third and fourth circuit boards 19 are partially clamped with each other not to deviate laterally.

Figure 8:
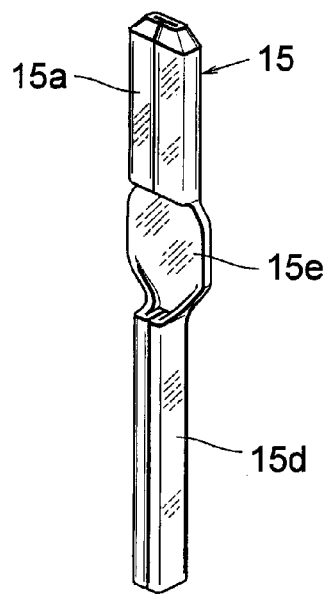
FIG. 8 is a perspective view showing an insertion terminal.

FIG. 8 is a perspective view depicting the insertion terminal 15 to be inserted into the reception terminal 22. A lower end of the insertion terminal 15 is formed as a substantially pin-shaped inserting end 15d which is inserted into the tubular connecting portion 22a of the reception terminal 22. The lower inserting end 15d extends via a middle portion 15e to an upper end which protrudes from the upper case 11. In order to connect the upper portion of the insertion terminal 15 to other connecting terminal, the upper portion is shaped in the form of a flat blade end 15a. It should be noted that the upper portion 15a of the insertion terminal 15 may be formed as the reception ends 15b or pin ends 15c shown in FIG. 1.

The pin-shaped inserting end 15d of the insertion terminal 15 is formed by folding a thin metal plate into a rod-shaped body having a rectangular cross section without vacant space. Therefore, although use is made of a metal plate having a very small thickness, it is possible to form the inserting end 15d having a side sufficiently wider than a thickness of the metal plate. Therefore, the inserting end 15d could hardly bent or broken. Moreover, the upper flat blade end 15a of the insertion terminal 15 is formed by folding the metal plate such that a thickness of the flat blade end 15a is larger than a thickness of the metal plate by two times.

In order to attain a feeling of click upon inserting the insertion terminal 15 into the reception terminal 22 as well as a good electrical connection, plural steps may be formed in the inserting end 15d. There are prepared various kinds of the insertion holes 15d having the inserting ends of different sizes corresponding to sizes of the reception terminals 22.

Middle portions 15e of several insertion terminals 15 are inserted into terminal insertion holes formed in the block bodies 16 made of synthetic resin. As depicted in FIG. 1, all the inserting ends 15d of the insertion terminals 15 are inserted into the circuit boards 19. It should be noted that in order to fix the middle portions 15e of the insertion terminals 15 to the inserting holes, claw portions not shown in the drawings are provided on the middle portions 15e of the insertion terminals 15.

Figure 9:
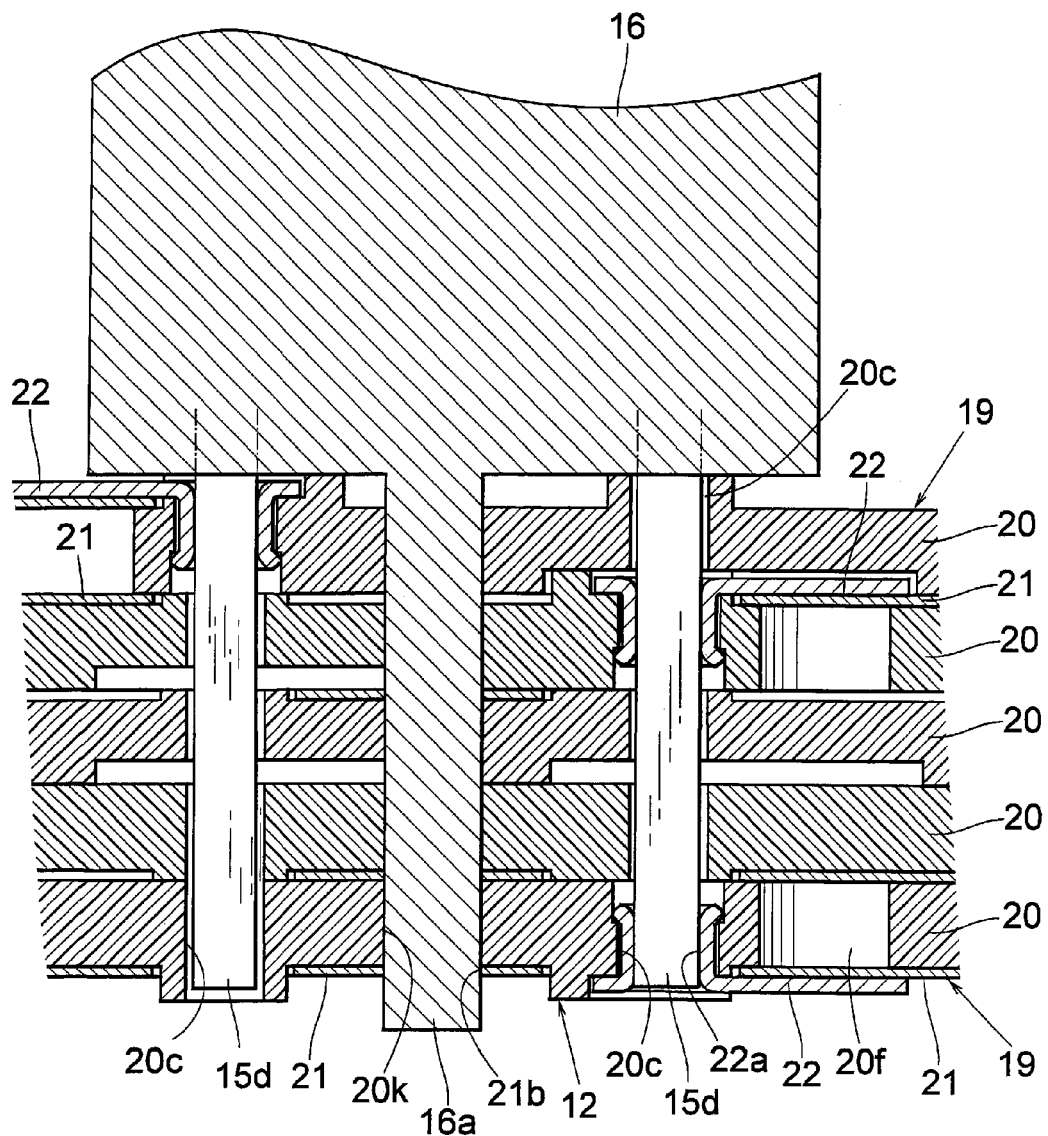
FIG. 9 is across sectional view illustrating the circuit board and block body.

As shown in FIG. 9, a single or plural anchor pin 16a are formed to extend from the bottom of the block body 16 and are inserted into the pin receiving holes 21b formed in the foil circuits 21 as well as the pin receiving holes 20k commonly formed in the respective resin plates 20. A lower end of the anchor pin 16a projecting out of the lowermost circuit board 19 is melted and pushed against the lowermost circuit board 19. In this manner, the block body 16 can be fixed to the circuit unit 12 and a plurality of circuit boards 19 within the stack can be stably fixed one another.

Figure 10:
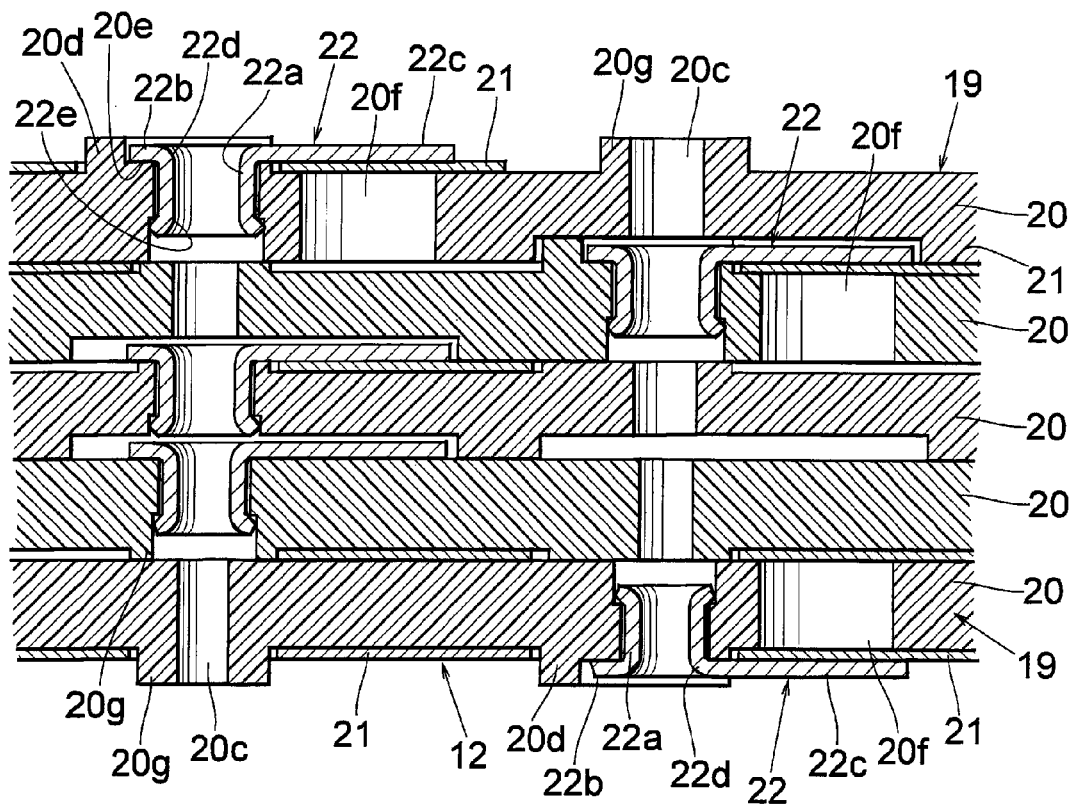
FIG. 10 is a cross sectional view depicting a major portion of another embodiment of the stacked circuit boards having reception terminals fixed thereto.
Figure 11:
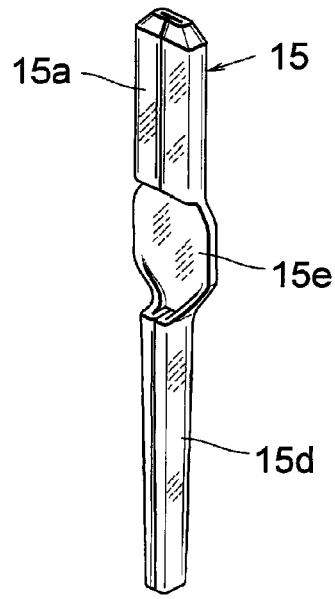
FIG. 11 is a perspective view showing another embodiment of the insertion terminal.

FIG. 10 shows another embodiment of the circuit board 19 according to the invention. In the stack of circuit boards 19, a diameter of terminal receiving holes 20c formed in successive layer circuit boards 19 is gradually reduced, and a diameter of reception terminals 22 provided in successive layer circuit boards 19 is reduced accordingly. At the same time, a diameter of pin-shaped inserting ends of 15d of insertion terminals 15 is gradually reduced as shown in FIG. 11. Therefore, the insertion terminals 15 secured to the block bodies 16 can be inserted into the stack of circuit boards 19.

Figure 12:
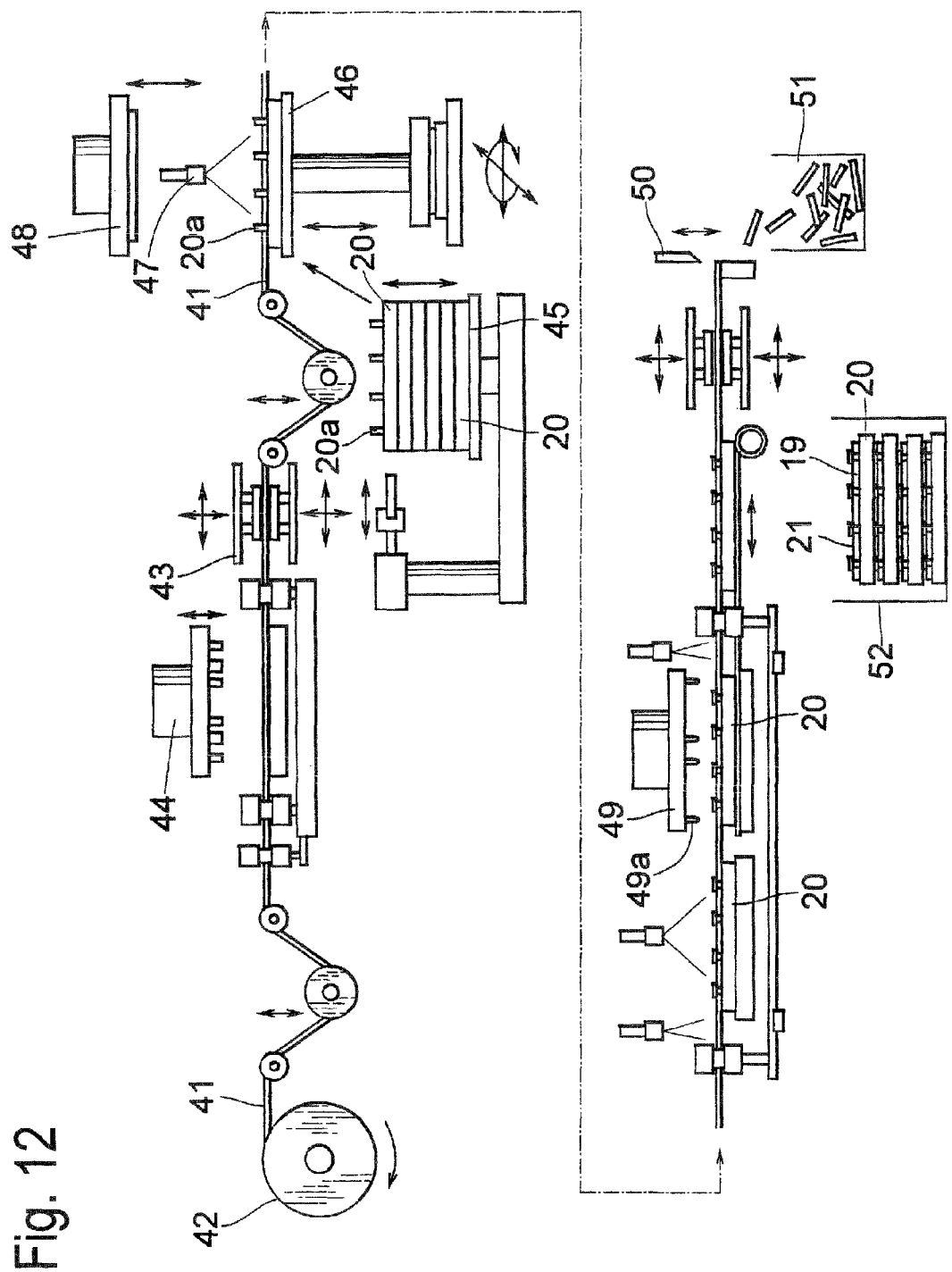
FIG. 12 is an explanatory diagram illustrating successive processes of the method of manufacturing the circuit board according to the invention.

FIG. 12 is an explanatory diagram representing successive steps of the method of manufacturing the circuit board 19 according to the invention. A copper foil 41 used for the foil circuit 21 as a starting material is wound around a roller 42 in the form of a coil. The copper foil 41 is fed intermittently by means of a transporting device 43 such as a clamp. Top this end, pilot holes may be formed in the copper foil 41. At first the copper foil 41 is fed to a hole forming press section and a plurality of pin receiving holes 21a and 21b are formed at a plurality of given positions by means of a hole forming press 44. Then, the copper foil 41 is transported to a section for stacking copper foil onto a resin plate 20. It should be noted that the pin receiving holes 21a formed in the copper foil 41 are used to fix the foil circuit 21 to the resin plate 20, and thus the pin receiving holes 21a are formed in a portion of the copper foil 21 which is to be remained on the resin plate 20, said portion of the copper foil constituting the foil circuit 21.

A number of resin plates 20 are held in a stocker 45 and are fed one by one in synchronism with the transportation of the copper foil 41. The resin plate 20 may be formed by the injection molding of a synthetic resin film or by hot pressing of a synthetic resin substrate. The resin plate 20 has formed therein anchor pins 20a, hole portions 20b, 20f, terminal receiving holes 20c, circular ring portions 20d, 20g, step portions 20e, electric wire holding recesses 20h, hole portions 20i, depressions 20j, pin receiving holes 20k, through holes 20l and so on.

After a resin plate 20 has been transported from the stocker 45 onto a stacking stand 46, the stacking stand 46 moves upward toward the copper foil 41. Position of the stacking stand 46 is controlled in a three-dimensional manner by suitably processing an image signal supplied from an image pick-up camera system 47 such that the anchor pins 20a provided on the resin plate 20 are inserted into the pin receiving holes 21a formed in the copper foil 41.

When a large current capacity is required, two sheets of the copper foil 41 are stacked on the resin plate 20 to reduce an electric resistance for a current passing through the foil circuit 21. In this case, the above explained process is repeated twice, and then the stacked copper sheets are mutually fused using the fusing holes 20b formed in the resin plate 20 as shown in FIG. 5.

After inserting the anchor pins 20a into the pin receiving holes 21a to stack the copper foil 41 on the resin plate 20, a heat press 48 situating above the stacking stand 46 is moved downward and top portions of the anchor pins 20a are fused to clamp the copper foil 41 onto the resin plate 20. Since the positioning has been performed, the pin receiving holes 21b formed in the copper foil 41 into which the anchor pins 16a of the block bodies 16 have been inserted are aligned with the pin receiving holes 20k formed in the resin plate 20.

Next, the assembly of the resin plate 20 and copper foil 41 is fed into a punching press 49 and the copper foil 41 is punched into a given pattern to form the foil circuit 21. The punching press 49 includes Thompson blades 49a and the foil circuit 21 can be punched out of the copper foil 41 without injuring the resin plate 20. Upon punching the foil circuit 21, when a portion of the copper foil 41 which will be connected to one or more reception terminals 22 in the final circuit board 19, one or more terminal receiving holes having a diameter identical with an inner diameter of the reception circuit 22 are formed. When a portion of the copper foil 41 which will be not connected to any reception terminal 22, one or more holes having a diameter identical with an outer diameter of a peripheral portion of the circuit ring portion 20g are formed.

Furthermore, the copper foil 41 is fed together with the resin plate 20, and wasted portions of the copper foil 41 which are not used in the foil circuit 21 are pealed off the resin plate 20 and are cut into pieces by a cutter 50. These pieces of copper foil 41 are thrown into a waste box 51. The resin plate 20 having the foil circuit 21 secured onto its surface constitutes a circuit board 19 and the thus formed circuit board 19 is fed in a given direction and is stacked in a stocker 52.

Figure 13:
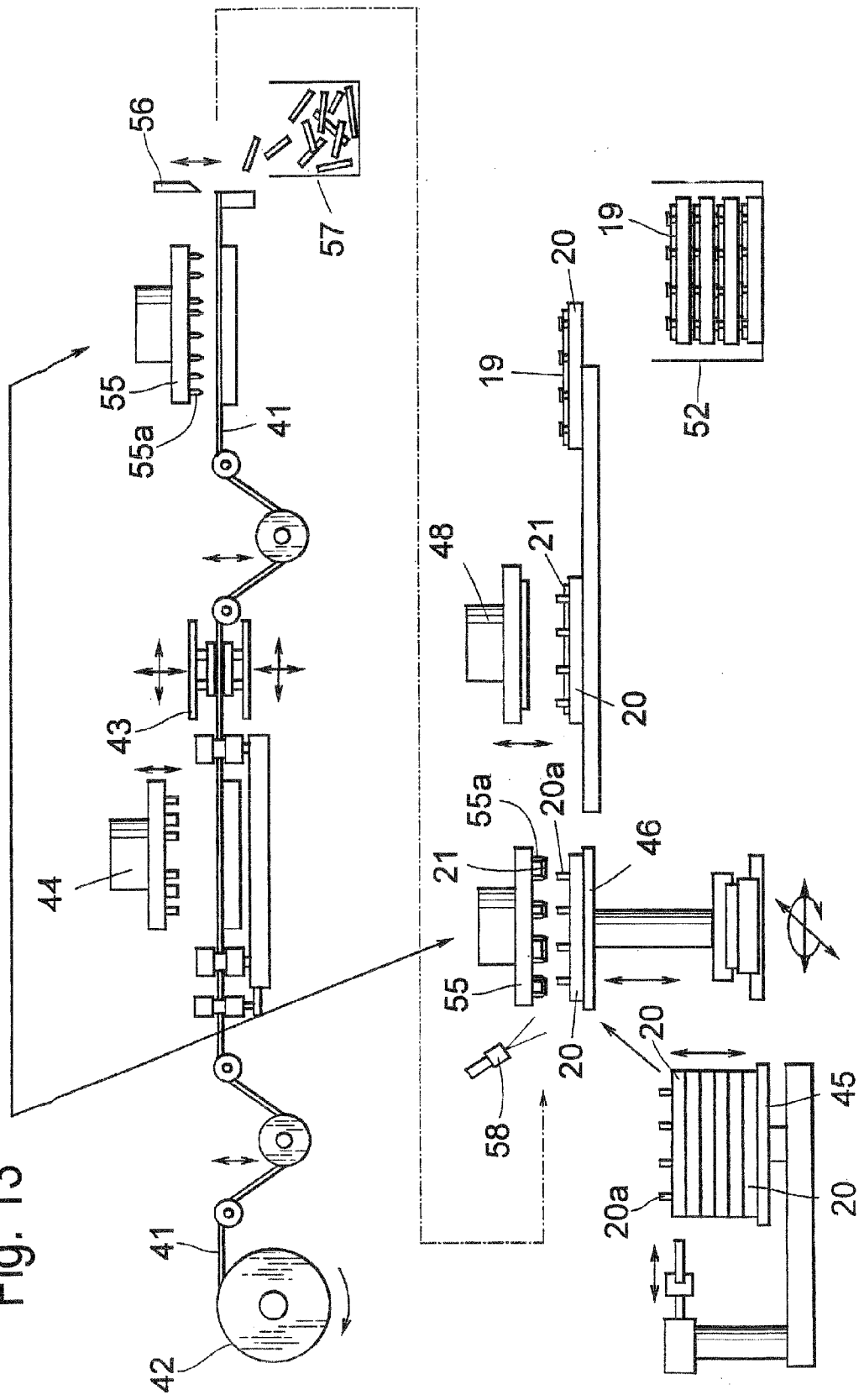
FIG. 13 is an explanatory diagram illustrating successive processes of another embodiment of the method of manufacturing the circuit board according to the invention.

FIG. 13 is an explanatory diagram showing another embodiment of the method of manufacturing the circuit board 19 according to the invention. In the present embodiment, similar portions to those shown in FIG. 12 are denoted by the same reference numerals used in FIG. 12. A copper foil 41 serving as a starting material of a foil circuit 21 is wound around a roller 42 in the shape of a coil. In the copper foil 41 there are formed a number of pin receiving holes 21a, 21b by means of a hole forming press 44. The copper foil 41 is fed into a circuit pattern punching section like as the embodiment illustrated in FIG. 12.

Figure 14:
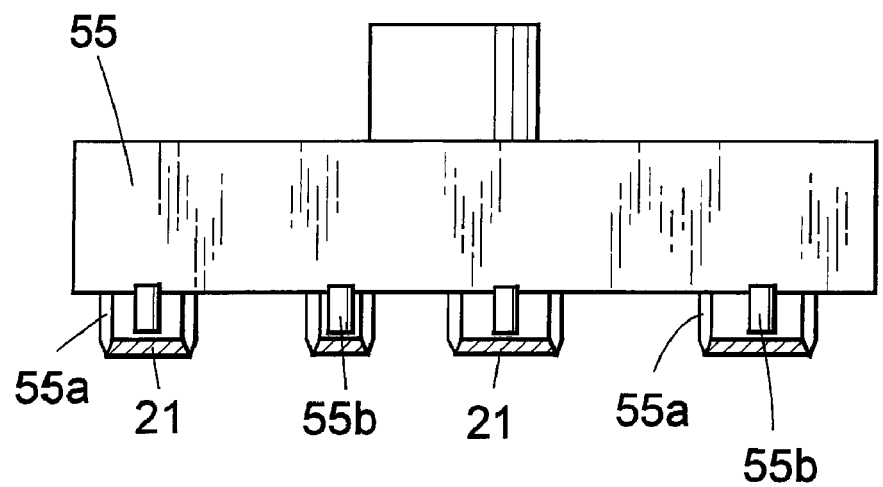
FIG. 14 is a cross sectional view showing a step of holding a foil circuit with a Thompson blade.

Next, the copper foil 41 is fed to a punching press 55 and a foil circuit 21 is punched out of the copper foil 41, while a suitable image processing is performed. As illustrated in FIG. 14, the punching press 55 includes a number of Thompson blades 55a to cut the copper foil 41 into the foil circuit 21 having a given pattern. Between successive Thompson blades 55a, there are provided a plurality of suction pads 55b to suck and hold the punched out foil circuit 21. Then, the foil circuit 21 is fed into a given position by means of a Thompson blade transporting device not shown in the drawings.

A remaining portion of the copper foil 41 is fed to a cutting blade 56 and is cut into pieces. These pieces of the copper foil 41 are thrown into a waste box 57.

The resin plate 20 stacked within a stocker 45 are fed one by one onto a stacking stand 46. The feeding of the copper foil 41 is synchronized with the punching operation at the punching press 55. Then, the foil circuit 21 held by the Thompson blades 55a is fed onto the resin plate 20 transported on the stacking stand 46. During this operation, a position of a Thompson blade transporting device not shown in the drawings is controlled in a three-dimensional manner, while an image processing is performed using an image pick-up camera system 58 such that the anchor pins 20a are inserted into the pin receiving holes 21a formed in the foil circuit 21.

After inserting the anchor pins 20a into the pin receiving holes 21a of the foil circuit 21 to place the foil circuit 21 on the resin plate 20 at a given position, an air blows from the suction pads 55b against the foil circuit 21 to separate the foil circuit 21 from the Thompson blades 55a and to push the foil circuit 21 onto the resin plate 20. It should be noted that the foil circuit 21 may be pushed onto the resin plate 20 by means of pushing pins provided between successive Thompson blades 55a.

After that, the Thompson blades 55a are transported by the Thompson blade transporting device into the original position on the punching press 55. A heat press 48 is moved downward onto the resin plate 20 having the foil circuit 21 placed thereon and top portions of the anchor pins 20a are fused and then are pushed against the foil circuit 21 to fix the foil circuit 21 onto the resin plate 20.

Figure 15:
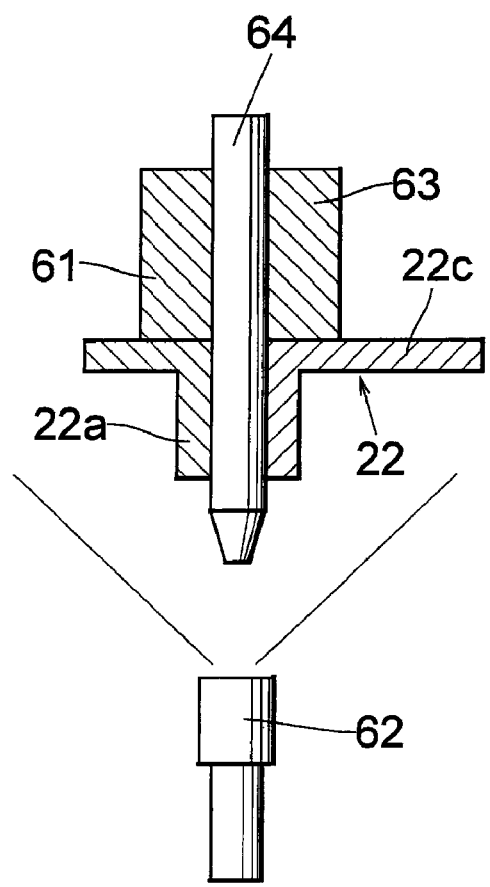
FIG. 15 is an explanatory diagram illustrating a step of holding a reception terminal with a robot hand.
Figure 16:
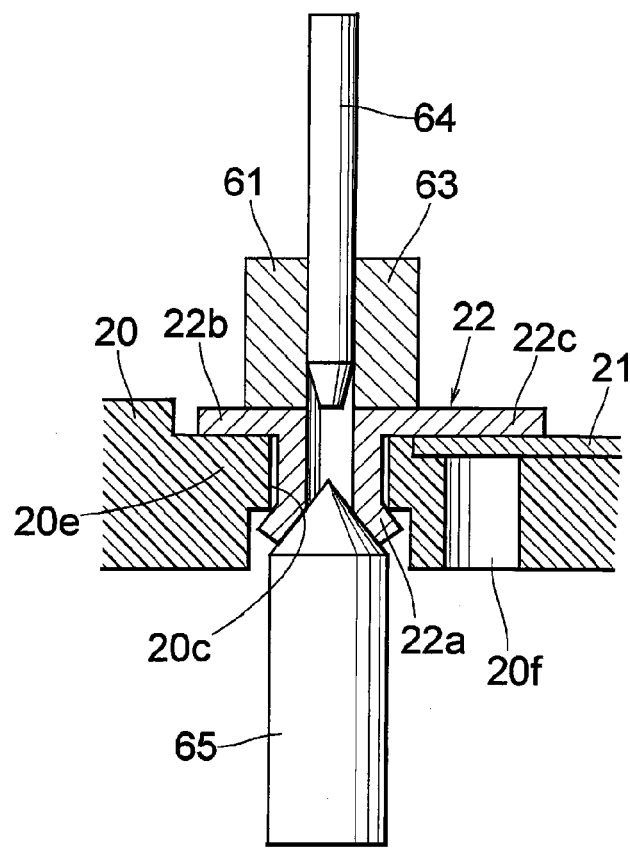
FIG. 16 is an explanatory diagram of a step of fixing a reception terminal to a circuit board.
Figure 17:
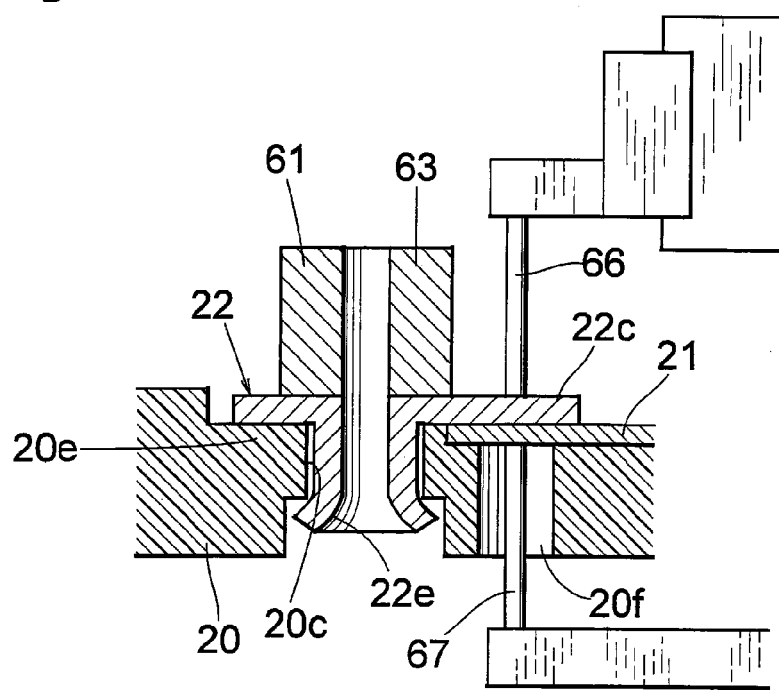
FIG. 17 is an explanatory diagram of a step of fusing a reception terminal to a foil circuit.

FIGS. 15-17 are explanatory diagrams showing a process for fixing the reception terminal 22 to the circuit board 19. A number of reception terminals 22 are successively fed in an aligned manner by means of a parts feeder, and a reception terminal 22 is held by a robot hand 61 as shown in FIG. 15 and is fed into a given position above the circuit board 19, while an image processing is performed by treating an image signal supplied from an image pick-up camera system 62. The robot hand 61 includes a tubular member 63 and a hanging pin 64 which is arranged movably up and down through the tubular member 63. The hanging pin 64 is inserted into a tubular connecting portion 22a of a reception terminal 22 and the reception terminal 22 is held by the hanging pin 64 due to a frictional resistance. A mutual position of the robot hand 61 and a circuit board 19 is controlled by the image processing and the reception terminal 22 is inserted into a terminal receiving hole 20c such that a tab portion 22c of the reception terminal 22 is placed on a foil circuit 21 provided on the resin plate 20.

While the reception terminal 22 is urged against a step portion 20e of the resin plate 20 by the tubular member 63, the hanging pin 64 is moved upward. Next, a press pin 65 having a conical tip is moved upward into the terminal receiving hole 20c to push and expand outwardly a lower end of the tubular connecting portion 22a to clamp the reception terminal 22 to the resin plate 20 as depicted in FIG. 16.

Then, the tab portion 22c is welled to the foil circuit 21 by means of electrodes 66 and 67 as illustrated in FIG. 17. Tips of the electrodes 66 and 67 are formed in the shape of a circular rod having a diameter of about 1 mm. The upper electrode 66 is brought into contact with the tab portion 22c and the lower electrode 67 is brought into contact with the lower surface of the foil circuit 21 through the welding hole 20f formed in the resin plate 20. It should be noted that the tab portions 22c of a plurality of reception terminals 22 may be welled to the foil circuit 21 successively using a robot hand or may be simultaneously welled to the foil circuit 21 by means of a plurality of welding electrodes.

Figure 18:
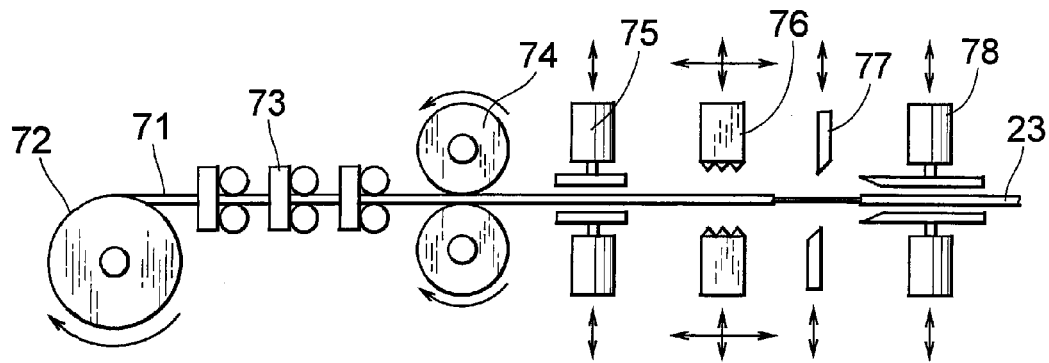
FIG. 18 is an explanatory diagram of a step in which a rectangular electric wire is formed.
Figure 19:
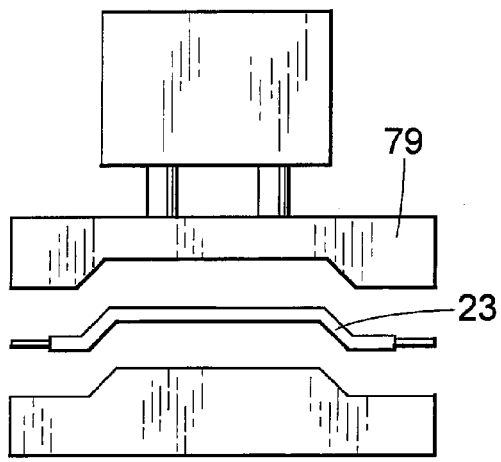
FIG. 19 is an explanatory diagram of a step of folding a rectangular electric wire.
Figure 20:
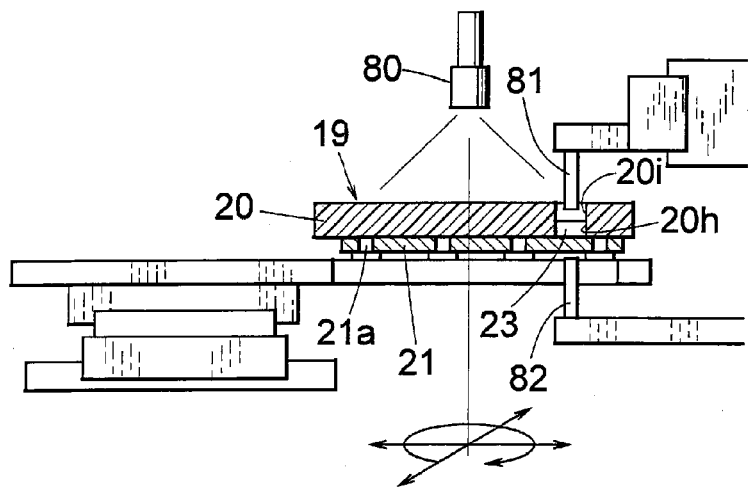
FIG. 20 is an explanatory diagram of a step of fusing a rectangular electric wire to a foil circuit.

FIGS. 18-20 are explanatory diagrams representing a process of securing the rectangular electric wire 23 into the wire holding recess 20h formed in the resin plate 20. A rectangular electric wire 71 comprising a rectangular copper wire having a cross section of 0.3 mm×3 mm and an electrically insulating coating applied on the copper wire is wound on a roller 72 as depicted in FIG. 18. The rectangular electric wire 71 is rewound intermittently from the roller 72 and is first passed through correcting rollers 73 to remove undesired twist, while an amount of feeding of the electric wire 71 is measured by a length measuring rollers 74. After the rectangular electric wire 71 has been fed by a given length, the wire 71 is fixed by a chuck 75. While the electric wire 71 is fixed, the insulating coating applied on a given portion of the electric wire 71 is removed by a pealing machine 76. When the electric wire 71 is fed again such that said portion of the electric wire 71 from which the insulating coating has been pealed off is fed into a cutter 77, and the electric wire 71 is cut at a middle of said portion while fixed by a chuck 78.

In this manner, it is possible to obtain a rectangular electric wire 23 having a given length; while the insulating coating applied on both ends of the electric wire 23 have been removed. Then, both ends of the electric wire 23 are bent by means of a work pressing machine 79 as shown in FIG. 19. After turning the resin plate 20 up side down, the rectangular electric wire 23 is held by a robot hand and is inserted into the electric wire holding recess 20h. Then, as shown in FIG. 20, both ends of the rectangular electric wire 23 from which the insulating coating has been removed are pushed against the rear surface of the foil circuit 21 through wire inserting holes 20i formed in the resin plate 20, while an image signal supplied from an image pick-up camera system 80 is suitably processed. Then, the both ends of the rectangular electric wire 23 are welded to the foil circuit 21 by means of welding electrodes 81, 82.

A plurality of the circuit boards 19 having different circuit patterns as stacked one another and the block bodies 16 are placed on the stack of the circuit boards 19 as shown in FIG. 9 to insert the inserting ends 15d of the insertion terminals 15 fixed to the block bodies 19 are inserted into the terminal receiving holes 20c formed in the circuit boards 19. Then, the inserting ends 15d of these insertion terminals 15 are inserted into the tubular connecting portions 22a of the reception terminals 22 secured to the circuit boards 19.

Since the inserting end 15d of the insertion terminal 15 is formed to have a substantially square cross section, corner portions of the inserting end are brought into contact with the tubular connecting portion 22a of the reception terminal 22 in a sufficient manner and a good electrical connection can be attained between the insertion terminal 15 and at least one foil circuit 21 of one or more circuit boards 19. As a case may be, the block bodies 16 are mounted on the circuit unit 12 from a lower side.

When the inserting ends 15d are inserted, the anchor pins 16a extending from the block bodies 16 are passed through the pin receiving holes 20k formed in the stack of circuit boards 19. Then, tip portions of the anchor pins 16a projecting from the pin receiving holes 20k are fused to complete the manufacturing of the circuit unit 12.

Next, the this formed circuit unit 12 is sandwiched between the upper case 11 and the lower case 13, and these cases are locked with each other by means of the locking portions 14a, 14b. Finally the above mentioned various kinds of elements and connectors are connected to the flat blade ends 15a, receiving ends 15b and pin ends 15c to form the joint box.

Figure 21:
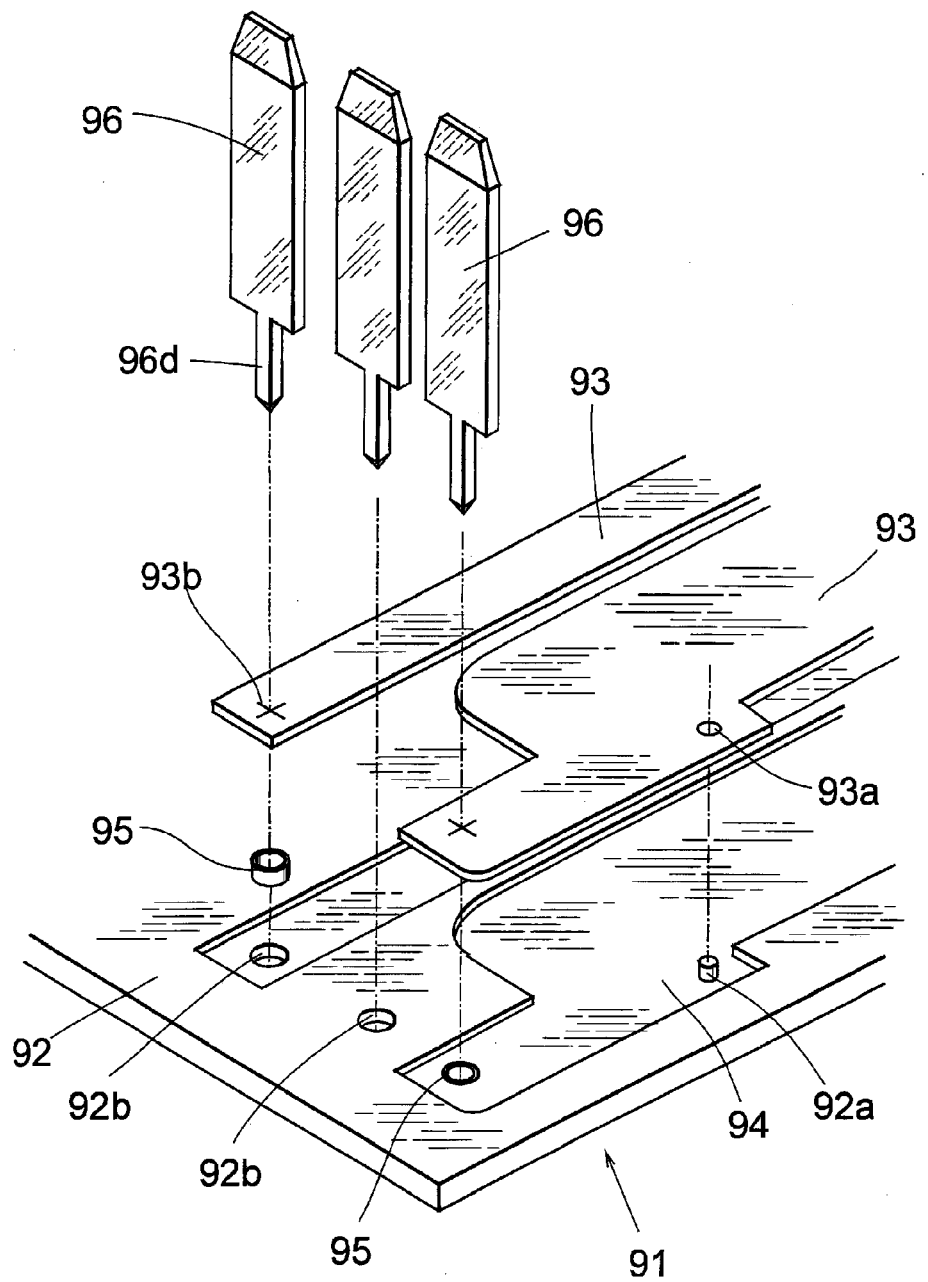
FIG. 21 is a perspective view showing a process of assembling another embodiment of the circuit board according to the invention.

FIGS. 21-27 show another embodiment of the circuit board according to the invention. As illustrated in FIG. 21, a respective circuit board 91 comprises a resin plate 92 formed by the injection molding of an electrically insulating synthetic resin and having a maximum thickness of about 1.5 mm, and foil circuits 93 formed by a copper foil having a thickness of 120 μm. The foil circuits 93 are formed to have given circuit patterns and are placed on the resin plate 92. In a top surface of the resin plate 92, there are formed depressed portions 94 having contour configuration corresponding to respective foil circuits 93 and having a depth identical with a thickness of the foil circuits 93. Therefore, the foil circuits 93 can be easily placed on the resin plate 92 at correct positions.

The resin plate 92 has formed therein a plurality of anchor pins 92a extending upwardly. When the foil circuits 93 are placed on the resin plate 92, the anchor pins 92a are inserted into pin receiving holes 93a formed in the foil circuits 93. By fusing tips of the anchor pins 92a, the foil circuits 93 can be fixed to the resin plate 92. When a large current capacity is required, two or more than two foil circuits 93 may be stacked like as the previous embodiment.

Figure 22:
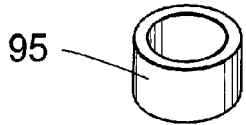
FIG. 22 is an expanded perspective view illustrating a reception ring.
Figure 23:
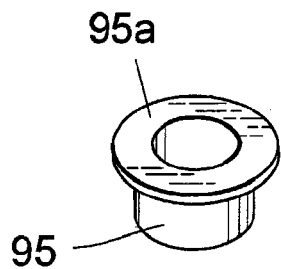
FIG. 23 is a perspective view depicting another embodiment of the reception ring.

In resin plates 92 stacked one another, there are commonly formed circular terminal receiving holes 92b and circular reception rings 95 shown in FIG. 22 are inserted into terminal receiving holes 92b formed in given circuit board 91. The reception ring 95 is formed as a circular ring, but may be formed as a rectangular or square ring. There are prepared various kinds of reception rings 95 having different sizes corresponding to different current capacities, and therefore the terminal receiving holes 92b have different sizes. The reception ring 95 is made of stainless steel and is formed by cutting a pipe having a circular or rectangular or square cross section. It should be noted that the reception ring 95 may include a flange portion 95a as illustrated in FIG. 23.

Figure 24:
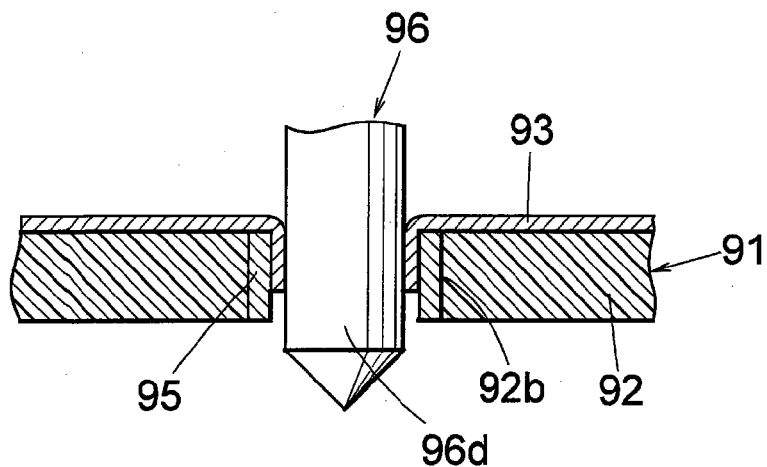
FIG. 24 is a cross sectional view showing a condition in which an insertion end is inserted into the reception ring via a foil circuit.
Figure 25:
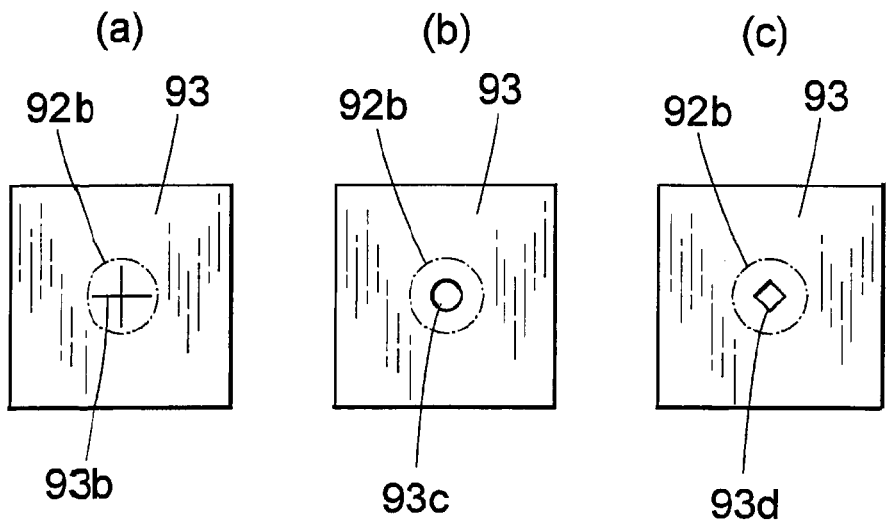
FIGS. 25(a), 25(b) and 25(c) are plan views depicting several embodiments of the cut portion.

In the foil circuits 93 situating above the reception rings 95 clamped into the terminal receiving holes 92b, there are formed cross-wire cut portions 93b. When an inserting end 96d of a connection terminal 96 is inserted into the cross-wire cut portion 93b as illustrated in FIG. 24, the cut portion 93b is expanded and the foil circuit 93 is clamped between the reception ring 95 and the inserting end 96d of the connection terminal 96 to establish a good electrical connection between the inserting end 95d and the foil circuit 93. At the inserting end 95d which is not required to be electrically conductive, the reception ring 95 is not clamped, and in circuit patterns around the terminal receiving holes 92b, openings are formed or removed not to be electrically conductive.

By sharpening the inserting end 96d as depicted in FIG. 21, the connection terminal 96 can be easily inserted. Furthermore, the inserting end 96d of the connection terminal 96 is formed to have a square cross section also as shown in FIG. 21, and therefore the cross-wire cut portion 93b can be easily expanded and a good contact can be attained between the inserting end 96d of the connection terminal 96 and the reception ring 95.

In the present embodiment, a cross-wire cut portion 93b is formed in the foil circuit 93 as shown in FIG. 25(a), but according to the invention, a circular hole 93c shown in FIG. 25(b) or a rectangular hole 93d depicted in FIG. 25(c) may be formed in the foil circuit 93.

Figure 26:
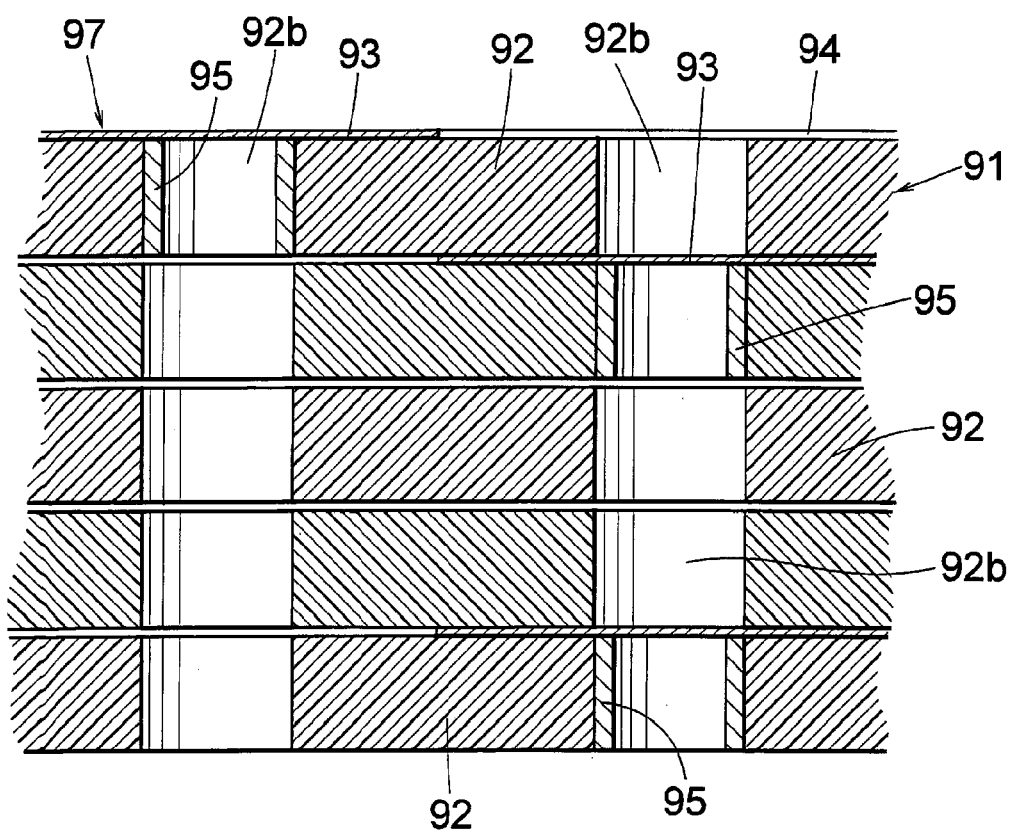
FIG. 26 is a cross sectional view illustrating a major part of the circuit unit formed by a stack of circuit boards.

FIG. 26 is a cross sectional view showing a major portion of a circuit unit 97 including a stack of five circuit boards 91. At four corners of respective circuit boards 91 there are formed protrusions and depressions by means of which the circuit boards 91 can be stacked stably.

Figure 27:
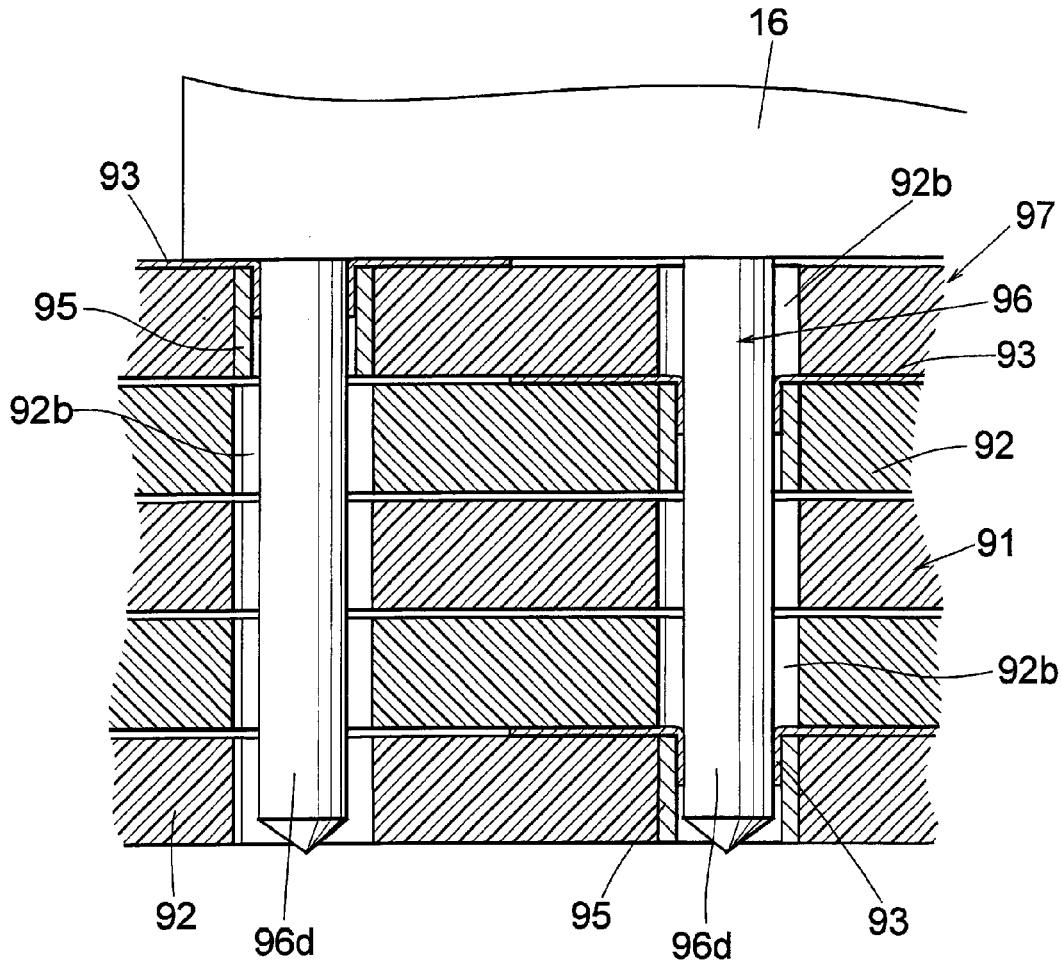
FIG. 27 is a cross sectional view showing a condition in which an insertion end is inserted into the stacked circuit boards.
Figure 28:
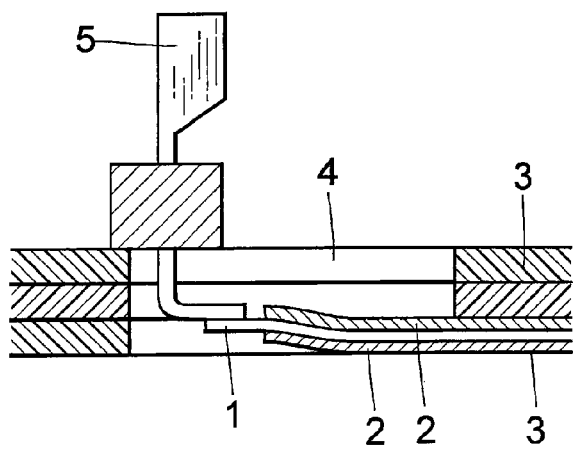
FIG. 28 is a cross sectional view depicting a portion of a known circuit board.

A plurality of circuit boards 91 each having different circuit patterns are stacked one another and block bodies 16 are placed on the uppermost circuit board 91 as shown in FIG. 27 and inserting ends 96d of connection terminals 96 fixed to the block bodies 16 are inserted into terminal receiving holes 92b formed in the circuit boards 91. Then, the inserting ends 96d of the connection terminals 96 are brought into contact with the reception rings 95 provided in the circuit boards 91 and are electrically connected to the foil circuits 93 to form the three-dimensional circuit unit 97 using the stack of the circuit boards 91.

What is claimed is:

1. A joint box comprising:
 a plurality of circuit boards, each comprising:
  a resin plate having anchor pins projecting from a surface thereof, wherein the resin plate includes a plurality of terminal receiving holes, and welding holes provided adjacent to the plurality of terminal receiving holes;
  a metal foil circuit that is formed into a circuit pattern by punching out of a metal foil provided on said resin plate, wherein said metal foil has pin receiving holes into which said anchor pins of said resin plate are inserted; and
  a plurality of metal reception terminals each comprising a tubular connecting portion provided in respective ones of the plurality of terminal receiving holes formed in the resin plate, wherein each of said reception terminals includes a tab portion fixed on said circuit pattern by welding;
 wherein a plurality of said circuit patterns of said circuit boards are electrically conducted to each other through said reception terminals by penetrating insertion terminals into said reception terminals in said terminal receiving holes; and
 wherein said circuit boards include protrusions and depressions and are stacked by clamping corresponding protrusions and depressions on one another.

2. The joint box according to claim 1, wherein each of said insertion terminals comprises a first pin-shaped inserting end and a second connecting terminal end.

3. The joint box according to claim 2, wherein said inserting end is rectangular in cross section.

* * * * *